United States Patent [19]
Pan

[11] Patent Number: 6,002,698
[45] Date of Patent: Dec. 14, 1999

[54] NONLINEARITY COMPENSATION OF LASER DIODE AND OTHER SEMICONDUCTOR DIODES

[75] Inventor: Jing-Jong Pan, Milpitas, Calif.

[73] Assignee: E-Tek Dynamics, Inc., San Jose, Calif.

[21] Appl. No.: 08/799,731

[22] Filed: Feb. 12, 1997

[51] Int. Cl.[6] ........................... H01S 3/00
[52] U.S. Cl. ........................... 372/38
[58] Field of Search ........................... 372/38

[56] References Cited

U.S. PATENT DOCUMENTS

| | | | |
|---|---|---|---|
| 4,032,802 | 6/1977 | Pan et al. | 307/311 |
| 5,077,619 | 12/1991 | Toms | 359/187 |
| 5,418,806 | 5/1995 | Araki | 372/38 |
| 5,436,749 | 7/1995 | Pidgeon, Jr. et al. | 359/161 |
| 5,448,629 | 9/1995 | Bosch et al. | 372/38 |

FOREIGN PATENT DOCUMENTS 1049418  11/1966  United Kingdom ............. H03C 7/00

*Primary Examiner*—Rodney Bovernick
*Assistant Examiner*—Robert E. Wise
*Attorney, Agent, or Firm*—Townsend and Townsend and Crew LLP

[57] ABSTRACT

A high-linearity light source comprising a first semiconductor diode (e.g., a light-source diode such as a laser diode or a light-emitting diode, or a light-receiving diode such as a photodetector) and a nonlinearity compensation network with a second, compensation, semiconductor diode is provided. The first and second diodes are connected in an antiparallel configuration with either an A.C. signal source (for light emission) or a load (for light receiving) and in separated D.C. bias paths.

By varying the relative biasing of the diodes (e.g., using a variable resistor in series with a diode), the capacitance of the combination of diodes cancels, and the linearity of the system improves. With a properly biased compensation diode the even-order nonlinearity distortion can be cancelled completely.

30 Claims, 4 Drawing Sheets

NONLINEARITY COMPENSATION OF LASER DIODE AND OTHER SEMICONDUCTOR DIODES

BACKGROUND OF THE INVENTION

The present invention relates to modulated semiconductor diodes, and more particularly, to reduced nonlinearity distortion of semiconductor diode light sources.

As optical communication demand increases, so does the need for better quality, lower distortion optical communication technology.

At the heart of optical transmission systems lies the light source. Light-emitting diodes (LEDs) and laser diodes commonly provide light for these systems. The inherently nonlinear junction capacitance of these devices, however, creates undesired harmonics and intermodulation products which introduce distortion, degrading their performance.

High linearity and low noise in the light source are critical factors in optical transmission systems. Others have sought to improve light-source linearity by improving light-source fabrication technology, reducing predistortion, and implementing feedback control. These methods, however, create undesirable high costs and manufacturing difficulties. The present inventor, in a previous invention (U.S. Pat. No. 4,032,802), improved the linearity by using an anti-series connection of diodes to reduce second- and third-order distortion harmonics.

The present invention uses an antiparallel connection of semiconductor diodes, with one diode reverse-biased, to improve upon the inventor's earlier, anti-series configuration distortion-reducing system, to reduce harmonic distortion while also reducing the D.C. power consumption, low-frequency noise, and heat generation, as compared to the anti-series connected system.

SUMMARY OF THE INVENTION

The present invention provides a nonlinearity compensation network for use with an A.C. signal source. In a preferred embodiment, the network comprises first and second semiconductor diodes connected in an antiparallel configuration with respect to each other, and in parallel with the signal source. These semiconductor diodes have a first and second voltage-variable capacitance characteristic respectively. A D.C. power supply circuit provides first and second bias voltages for the first and second semiconductor diodes respectively. By varying the relative biases of the semiconductors, the network capacitance can be adjusted to eliminate undesired harmonics which improves the linearity of the network.

In another preferred embodiment, the first semiconductor diode is a light-source diode, the second semiconductor diode is a compensation diode, and the power supply reverse-biases the compensation diode while forward-biasing the light-source diode. This biasing arrangement requires very little D.C. power consumption. In turn, the power supply generates little heat in the network, which prevents heat-related distortion.

In yet another preferred embodiment, a first power supply biases a light-source semiconductor diode while a second power supply biases a compensation semiconductor diode. This arrangement has the low D.C. power advantages mentioned above. Also, the first and second power supplies provide isolated D.C. bias paths allowing independent bias adjustment of the compensation semiconductor diode without affecting light-source diode performance.

DETAILED DESCRIPTION OF SPECIFIC EMBODIMENTS

Figure 1:
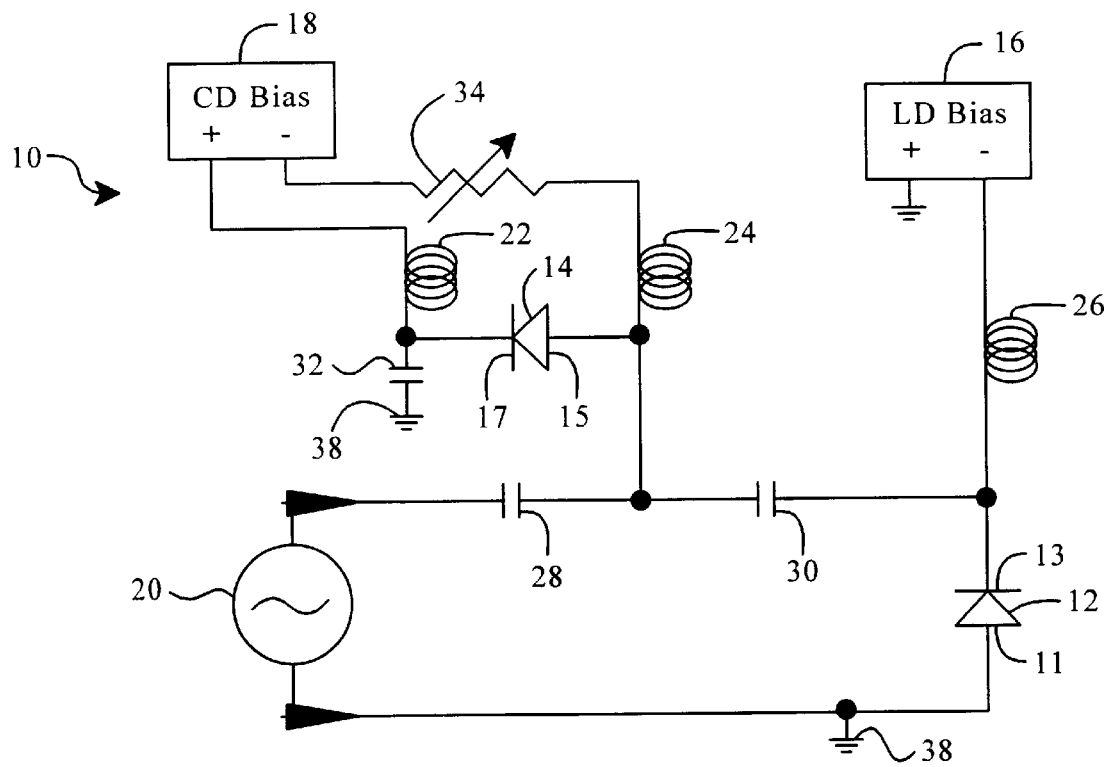
FIG. 1 is a schematic diagram of a preferred embodiment of the present invention.

FIG. 1 shows a preferred embodiment of an opto-electric circuit 10 of the present invention. An anode 11 of a light-source semiconductor diode 12 couples to a ground 38. A cathode 13 of light-source semiconductor diode 12 couples to an anode 15 of a compensation semiconductor diode 14 via a second capacitor 30. A cathode 17 of compensation semiconductor diode 14 couples to ground 38 via third capacitor 32.

Figure 2:
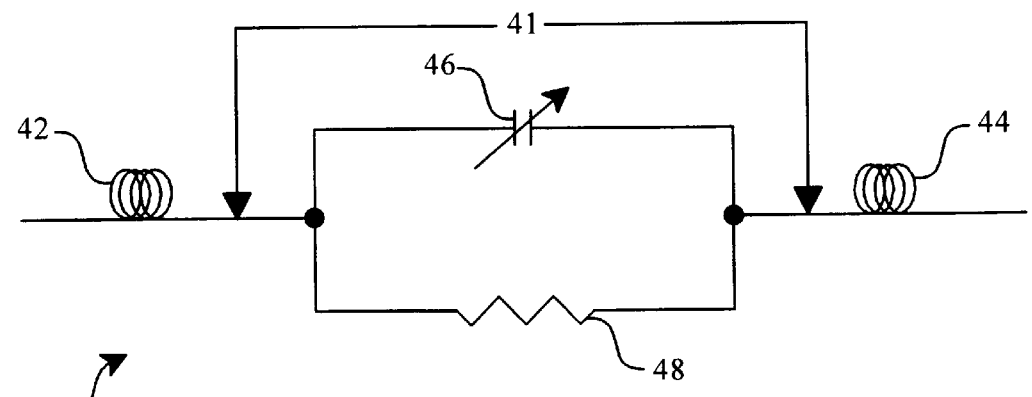
FIG. 2 is a diagram of an equivalent circuit of a semiconductor diode.

FIG. 2 shows a semiconductor diode equivalent circuit 40 of the light-source semiconductor diode 12 and the compensation semiconductor diode 14 with a junction voltage 41 applied. Bond wires on the diode yield first and second bond-wire inductances 42, 44. A junction capacitance 46 depends upon a junction depletion layer structure. A junction resistor 48 represents junction resistance and diffusion.

Figure 3:
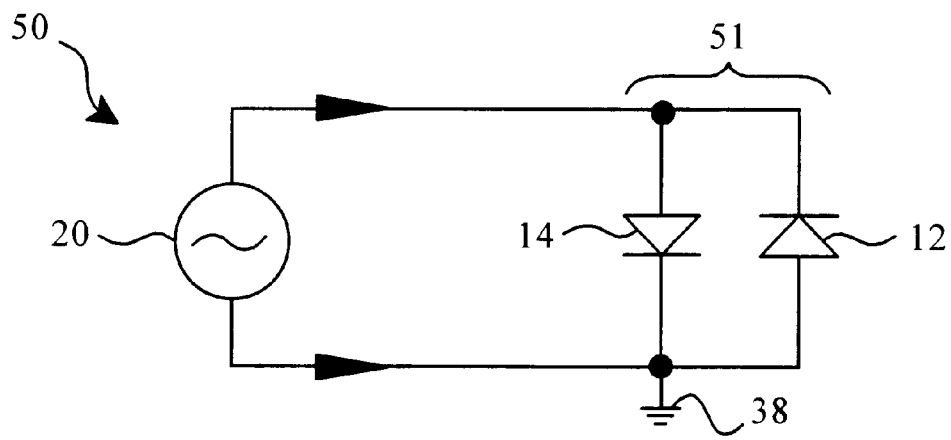
FIG. 3 is a diagram of a radio frequency (RF)/A.C. equivalent circuit of the present invention.

Referring again to FIG. 1, a skilled artisan will recognize this connection as an antiparallel connection of light-source semiconductor diode 12 and compensation semiconductor diode 14 with A.C. signal source 20. FIG. 3 shows an A.C. equivalent circuit 50 of opto-electric circuit 10. The antiparallel connection shown in FIG. 3 forms a nonlinearity-compensation network (NCN) 51. Light-source semiconductor diode 12 may be one of any of several types including, but not limited to, a laser diode (LD) or a light-emitting diode (LED). Compensation semiconductor diode 14 may also take any of several forms as long as it provides the desired circuit equivalents discussed below.

Figure 4:
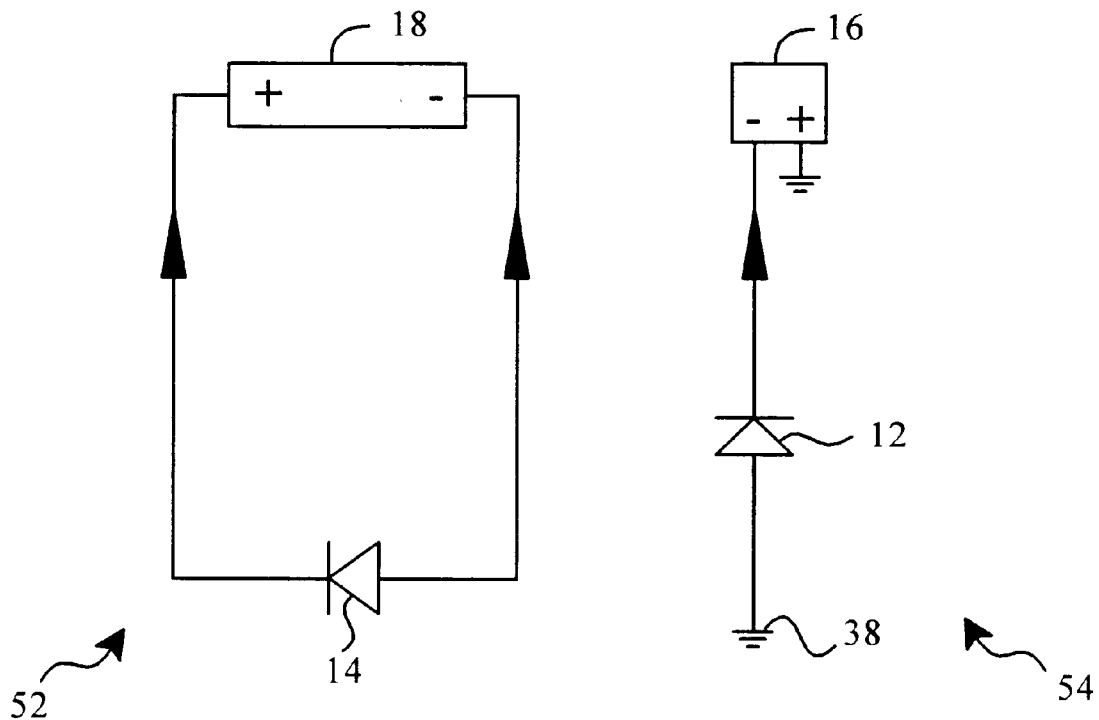
FIG. 4 is a diagram of a D.C. equivalent circuit of the present invention.

Returning to FIG. 1, the preferred embodiment comprises a bias network comprising separated D.C. bias supplies for light-source semiconductor diode 12 and compensation semiconductor diode 14 both isolated from A.C. signal source 20. A first bias source 16 provides a D.C. bias to light-source semiconductor diode 12. Second capacitor 30 isolates first bias source 16 from the circuitry to the left of second capacitor 30 and particularly a second bias source 18. This can be more readily seen by referring to a D.C. equivalent circuit of opto-electric circuit 10, and more particularly, light-source diode D.C.-bias equivalent circuit 54, as shown in FIG. 4. Still referring to FIG. 4, second bias source 18 provides a D.C. bias to compensation semiconductor diode 14 as seen in compensation diode D.C.-bias equivalent circuit 52. Again referring to FIG. 1, second bias source 18 provides a reverse-bias to compensation semiconductor diode 14. The bias applied to compensation semiconductor diode 14 may be adjusted by varying a resistance of a variable resistor 34. First, second, and third inductors 22, 24, and 26 help to isolate first and second bias sources 16 and 18 from A.C. signal source 20, yielding the equivalent circuits of FIGS. 3 and 4.

Analyzing A.C. equivalent circuit 50 (FIG. 3) with semiconductor diode equivalent circuit 40 substituted for light-source semiconductor diode 12 and compensation semiconductor diode 14 reveals the possibility for harmonic distortion reduction. A diode capacitance with biasing $V_0$ and modulating small signal v applied can be expressed as:

$$C = \frac{C_0}{(\theta - V_0)^n}\left(1 - \frac{v}{\theta - V_0}\right)^{-n} = K_0 + K_1 v + K_2 v^2 + K_3 v^3 + \ldots \quad (1)$$

where:

$C_0$ is a constant proportional to the junction capacitance 46;

$\theta$ denotes the diffusion potential of the diode; and n is a number dependent on impurity profiles of the diode junction.

$$K_0 = \frac{C_0}{(\theta - V_0)^n} \quad (2)$$

$$K_1 = \frac{nK_0}{\theta - V_0} \quad (3)$$

$$K_2 = \frac{n(n+1)K_0}{2(\theta - V_0)^2} \quad (4)$$

$$K_3 = \frac{n(n+1)(n+2)K_0}{6(\theta - V_0)^3} \quad (5)$$

Equations (3), (4) and (5) represent second-, third- and fourth-order distortions, respectively. Among them, the second-order contributes the largest single component of distortion. If a circuit could eliminate or reduce this order of distortion, and others if possible, then the harmonic distortion and intermodulation products of the electro-optical circuit 10 would decrease accordingly.

The present invention accomplishes distortion and intermodulation-product reduction by connecting the compensation semiconductor diode 14 and the light-source semiconductor diode 12 in an antiparallel relationship with A.C. signal source 20 in the NCN 51 (see FIG. 3). A biasing network provides a D.C. bias for each diode. Any incremental voltage v applied across the diodes by A.C. signal source 20 modulates the current through the diodes about their respective bias points. Due to the antiparallel connection, A.C. signal source 20 equally and oppositely affects the diode voltage across light-source semiconductor diode 12 and compensation semiconductor diode 14. In the preferred embodiment of the present invention, light-source semiconductor diode 12 is forward-biased, while compensation semiconductor diode 14 is reverse-biased.

In a preferred embodiment of the present invention, the light-source semiconductor diode 12 and compensation semiconductor diode 14 both comprise a semiconductor diode with an equivalent circuit as discussed above. Therefore, the capacitance of light-source semiconductor diode 12 and compensation semiconductor diode 14 can be expressed as:

$$C_1 = K_{10} - K_{11}V + K_{12}V^2 - \ldots \quad (6)$$

$$C_2 = K_{20} + K_{21}V + K_{22}V^2 + \ldots \quad (7)$$

where:

$C_1$ = light-source semiconductor diode 12

$C_2$ = compensation semiconductor diode 14

Combining Eqs. (6) and (7), we can get the total capacitance as:

$$C_\Sigma = C_1 + C_2 = K_{\Sigma 0} - K_{\Sigma 1} v + K_{\Sigma 2} v^2 - \ldots \quad (8)$$

where:

$$K_{\Sigma 0} = \frac{C_{10}}{(\theta - V_{10})^n} + \frac{C_{20}}{(\theta - V_{20})^n} \quad (9)$$

$$K_{\Sigma 1} = \frac{nK_{10}}{\theta - V_{10}} - \frac{nK_{20}}{\theta - V_{20}} \quad (10)$$

$$K_{\Sigma 2} = \frac{n(n+1)K_{10}}{2(\theta - V_{10})^2} + \frac{n(n+1)K_{20}}{2(\theta - V_{20})^2} \quad (11)$$

Biases of light-source semiconductor diode 12 and compensation semiconductor diode 14, $V_{10}$ and $V_{20}$ respectively, can be adjusted in the invention. So, it is easy to cancel second-order nonlinearity distortion completely by making $K_{\Sigma 1}$ be zero (see Eq. 10).

From Eqs. (1) and (5), if we make:

$$\frac{K_{10}}{\theta_1 - V_{10}} = \frac{K_{20}}{\theta_2 - V_{20}} \quad (12)$$

and $$(\theta_1 - V_{10})^2 = (\theta_2 - V_{20})^2 \quad (13)$$

all even-order distortion will be canceled completely. Therefore, the present invention can reduce distortion, improving performance.

The present invention yields several advantages over prior-art devices, including reduced cost, less D.C. power consumption, lower noise and fewer thermal-stability problems.

Moreover, the present invention yields advantages over an anti-series NCN configuration.

The present invention eliminates coupling between radio frequency (RF) and D.C., and low-frequency interference. Second capacitor 30 isolates second bias source 18 from the light-source semiconductor diode 12 because a capacitor behaves like an open circuit in response to D.C. power. This reduces the coupling between D.C. power and RF power. This isolation also helps to prevent low-frequency interference. First, second and third inductors 22, 24 and 26 prevent low-frequency interference in the present invention.

In the present invention the antiparallel NCN consumes less D.C. power, and consequently produces less heat, than an anti-series arrangement. An anti-series NCN uses current biasing and forward-biases the diodes, requiring large D.C. power consumption. The present invention uses voltage biasing and reverse-biases the compensation semiconductor diode 14. A reverse-biased diode draws much less current than a forward-biased diode. Less current with a voltage equal to or less than with an anti-series arrangement translates into less D.C. power consumption. By using less D.C. power, the present invention generates less heat. Therefore, the present invention reduces thermal-stability problems compared to an anti-series configuration.

Using an antiparallel configuration also yields a lower noise level in the present invention. Current variations in the large bias current of a forward-biased anti-series compensation diode create noise that current variations in the small bias current of the reverse-biased antiparallel compensation diode do not. While the relative variations may be similar, the sheer magnitude of the large forward-biased anti-series current magnifies the noise introduced to the system. Moreover, the reduction in RF/D.C. coupling discussed above also reduces the noise in the antiparallel configuration relative to the anti-series configuration.

The antiparallel configuration of the present invention also allows for higher operational frequencies than an anti-series configuration. Reverse-biasing the compensation semiconductor diode 14 expands its depletion region versus forward-biasing. In a p-n junction diode, an expanded depletion region means a larger separation of the positively-doped region (p-region) and negatively-doped region (n-region). This is similar to separating the plates of a parallel-plate capacitor. The effect yields a decreased capacitance (according to the well-know equation $C=(\epsilon \cdot A)/d$) as compared to a forward-biased diode. Decreased capacitance increases the diode's cutoff frequency because $f_c=1/(2\cdot\pi\cdot C_o\cdot R_s)$, where $f_c$ is a cutoff frequency of the diode, $C_o$ is a zero-bias capacitance of the diode, and $R_s$ is a series resistance of the diode 48. Reverse-biasing compensation semiconductor 14 reduces the capacitance, thereby increasing its cutoff frequency. This allows the network to operate at higher frequencies (up to 10 GHz) than with forward-biasing compensation semiconductor diode 14 as in an anti-series configuration. Moreover, substituting semiconductor diode equivalent circuit 40 for the light-source and compensation semiconductor diodes 12 and 14 respectively in A.C. equivalent circuit 50 yields a low effective inductance (parallel inductance addition), while an anti-series connection yields a higher inductance (series inductance addition). The lower effective inductance of the antiparallel arrangement allows for higher operational frequencies.

Another resulting improvement of the present invention is that the status of light-source semiconductor diode 12 does not change by changing the current in compensation semiconductor diode 14, while it does so in an anti-series connection of these diodes. The isolated D.C. bias paths allow for adjustment of the bias current in compensation semiconductor diode 14 independently of light-source semiconductor diode 12.

Figure 5:
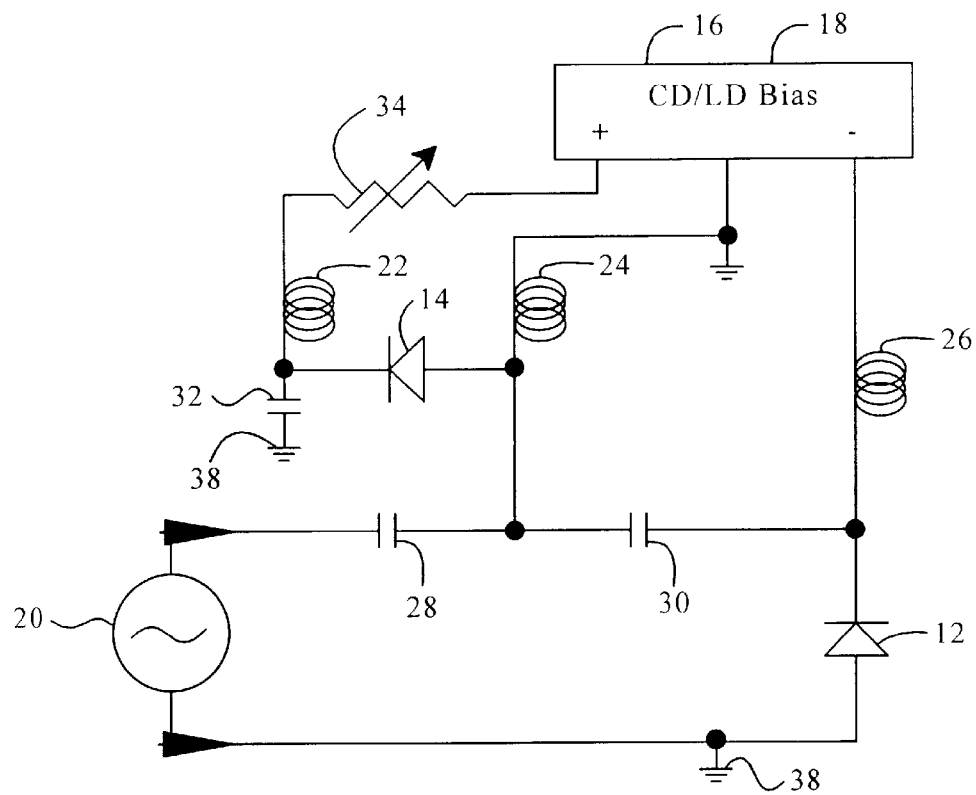
FIG. 5 is a schematic diagram of a second embodiment of the present invention.
Figure 6:
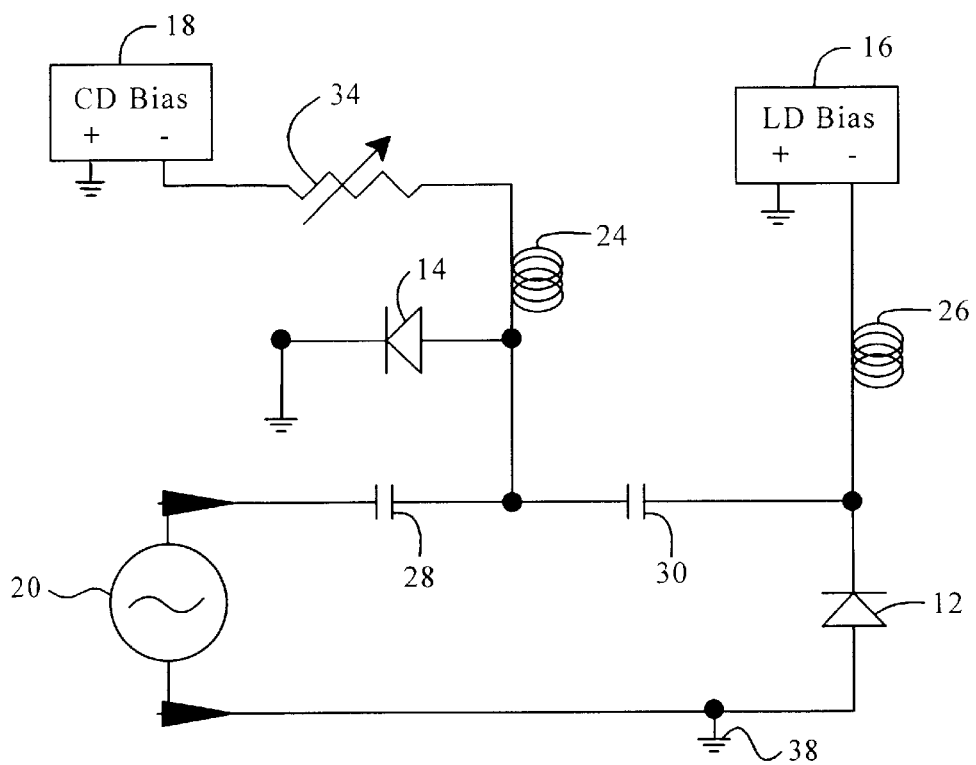
FIG. 6 is a schematic diagram of a third embodiment of the present invention.

Several variations on the schematic diagram of the present invention shown in FIG. 1 are possible without departing from the spirit and scope of the invention herein. For example, first and second bias sources 16, 18 may have a common ground (shown in FIG. 5). Compensation semiconductor diode 14 also may have a common ground terminal with the first and second bias sources 16, 18 (shown in FIG. 6). Comparing FIG. 1 with FIG. 6, a skilled artisan can see that the configuration of FIG. 6 eliminates the need for third capacitor 32 and first inductor 22.

Figure 7:
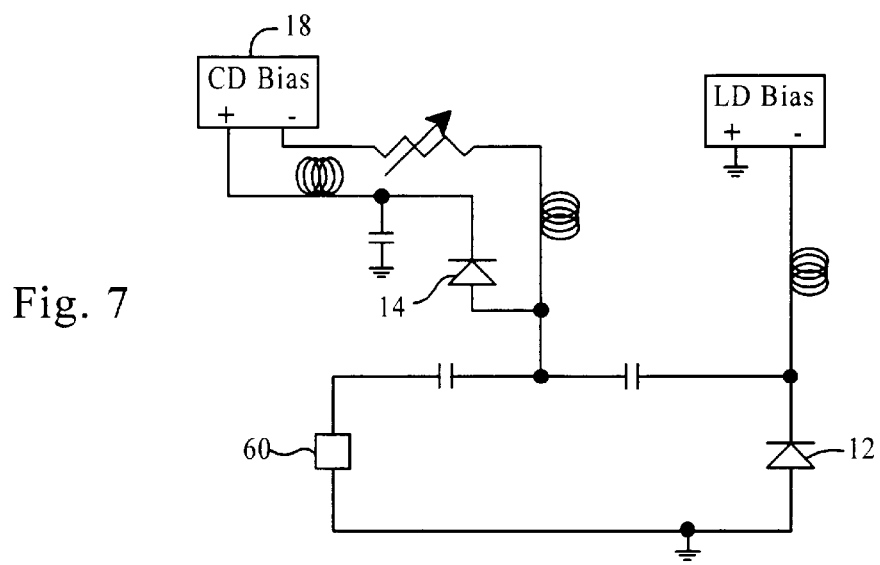
FIGS. 7–9 are schematic diagrams resembling FIGS. 1, 5, and 6 respectively, in the signal detector configurations.
Figure 8:
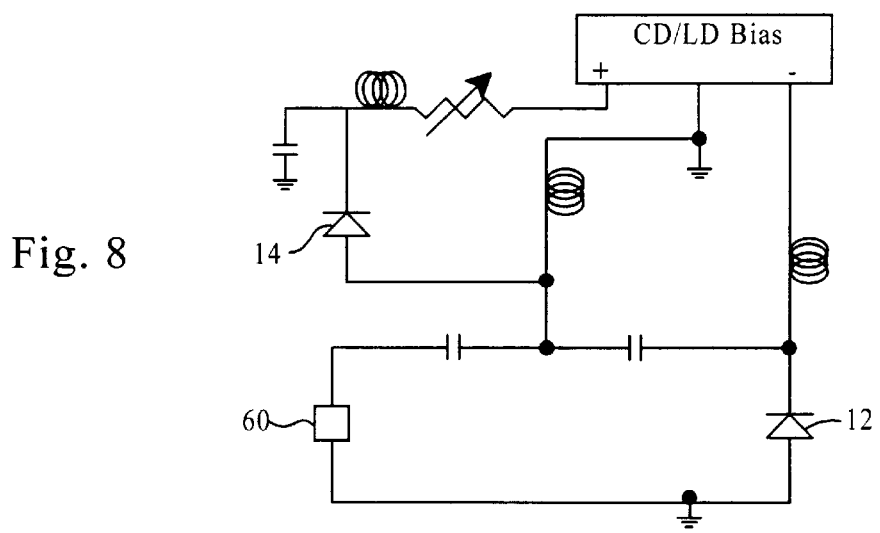
Figure 9:
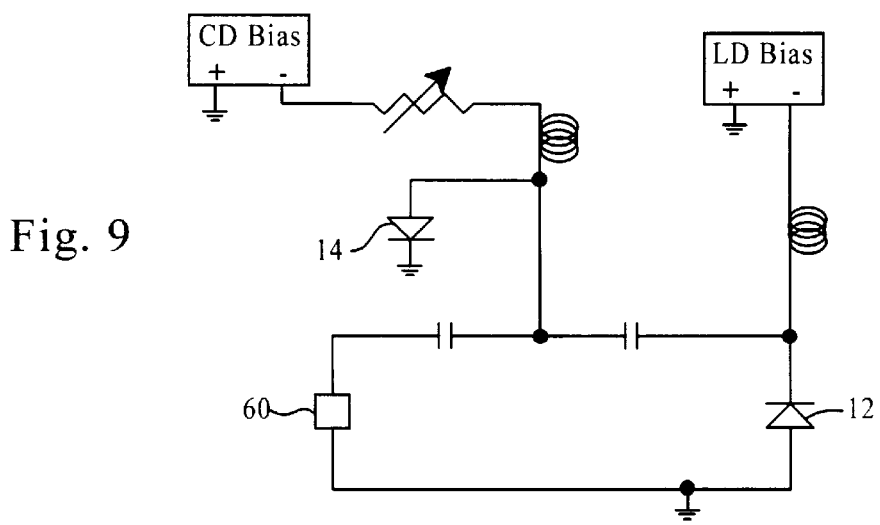

The present invention also encompasses other configurations. For example, one may replace light-source semiconductor diode 12 with other semiconductor diodes including, but not limited to, RF and microwave diodes. One may also replace light-source semiconductor diode 12 with a photodetector including, but not limited to, an avalanche photodiode (APD), a field-effect transistor (FET) or a PIN diode. Alternatively, the compensation semiconductor diode 14 may be used as a signal detector and the light-source semiconductor diode 12 as a compensation diode to achieve a high linearity signal detection network. FIGS. 7–9, which resemble FIGS. 1, 5 and 6 respectively, illustrate such configurations. Note that a signal received by the signal detector excites load 60, which replaces A.C. signal source 20 in the signal detector configurations illustrated.

While the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. A nonlinearity compensation network comprising:
   a first semiconductor diode having a first voltage-variable capacitance characteristic;
   a second semiconductor diode, coupled in an antiparallel configuration with the first semiconductor diode with respect to a signal source and having a second voltage-variable capacitance characteristic; and
   a D.C. power supply circuit, coupled to the first and second semiconductor diodes, for applying first and second bias voltages across the first and second semiconductor diodes respectively, such that the first and second bias voltages alter the first and second voltage-variable capacitance characteristics to reduce harmonic distortion in the first semiconductor diode output in response to said signal source.

2. The apparatus of claim 1 wherein the second bias voltage reverse-biases the second semiconductor diode.

3. The apparatus of claim 1 wherein the first semiconductor diode comprises a light-source semiconductor diode coupled to the signal source, the signal source comprising an A.C. signal source.

4. The apparatus of claim 1 further comprising an inductor and a capacitor, both coupled between the signal source and a D.C. power supply of the D.C. power supply circuit, the signal source comprising an A.C. signal source, the inductor for preventing passage of an A.C. signal from the A.C. signal source into a D.C. power supply of the D.C. power supply circuit, and the capacitor for preventing passage of D.C. power from the D.C. power supply circuit into the A.C. signal source.

5. The apparatus of claim 1 wherein the D.C. power supply circuit comprises a power supply having a first terminal coupled to a first end of the first semiconductor diode, a second terminal coupled to a first end of the second semiconductor diode, and a ground terminal coupled to a second end of the first semiconductor diode and a second end of the second semiconductor diode.

6. The apparatus of claim 1 wherein the D.C. power supply circuit comprises a first and a second power supply, the first power supply coupled to the first semiconductor diode and applying the first bias voltage, and the second power supply coupled to the second semiconductor diode and applying the second bias voltage.

7. The apparatus of claim 6 further comprising a capacitor coupled between the first and second semiconductor diodes.

8. The apparatus of claim 1 wherein the first semiconductor diode comprises a photodetector coupled to a load.

9. The apparatus of claim 1 wherein the first semiconductor diode comprises an RF diode.

10. The apparatus of claim 1 wherein the first semiconductor diode comprises a microwave diode.

11. The apparatus of claim 1 further comprising a variable resistor coupled in series with a D.C. power supply of the D.C. power supply circuit and the second semiconductor diode.

12. A low-distortion opto-electric circuit for use with an A.C. signal source, the opto-electric circuit comprising:
   a light-source semiconductor diode having a first voltage-dependent capacitance characteristic;
   a compensation semiconductor diode, coupled in an antiparallel configuration with the light-source semiconductor diode across the A.C. signal source and having a second voltage-dependent capacitance characteristic; and a D.C. power supply circuit, coupled to the light-source and compensation semiconductor diodes, for applying first and second bias voltages across the light-source and the compensation semiconductor diodes respectively.

13. The apparatus of claim 12 wherein the light-source semiconductor diode comprises a laser diode.

14. The apparatus of claim 12 wherein the light-source semiconductor diode comprises a light-emitting diode.

15. The apparatus of claim 12 wherein the D.C. power supply circuit reverse-biases the compensation semiconductor diode and forward-biases the light-source semiconductor diode.

16. The apparatus of claim 12 wherein the first and second voltage-dependent capacitance characteristics are substantially similar.

17. A high-linearity opto-electric semiconductor diode network for use with an A.C. signal source, the network comprising:

a light-source semiconductor diode having a first voltage-variable capacitance characteristic, a compensation semiconductor diode, coupled in an antiparallel configuration with the light-source semiconductor diode and the A.C. signal source, having a second voltage-variable capacitance characteristic, a first power supply, coupled to the light-source semiconductor diode, for applying a forward bias voltage across the light-source semiconductor diode, a second power supply, coupled to the compensation semiconductor diode, for applying a reverse bias voltage across the compensation semiconductor diode, a first capacitor, coupled between the first and second power supplies, for isolating the first and second power supplies, a second capacitor, coupled between the A.C. signal source and the first power supply, for preventing passage of D.C. power from the first power supply into the A.C. signal source, a third capacitor, coupled between the A.C. signal source and the second power supply, for preventing passage of D.C. power from the second power supply into the A.C. signal source, and a variable resistor coupled in series with the compensation semiconductor diode and the second power supply such that manipulating the variable resistor adjusts the second voltage-variable capacitance characteristic to reduce harmonic distortion in the light-source semiconductor diode.

18. A nonlinearity compensation network for semiconductor diodes responsive to a varying signal, the network comprising:

a first semiconductor diode having a first voltage-variable capacitance characteristic;

a second semiconductor diode having a second voltage-variable capacitance characteristic substantially similar to the first voltage-variable characteristic of the first semiconductor diode; and a D.C. power supply circuit, coupled to the first and second semiconductor diodes, for applying first and second bias voltages across the output and second semiconductor diodes respectively such that the first and second bias voltages are isolated from each other;

the second semiconductor diode coupled in an antiparallel configuration with the first semiconductor diode with respect to the varying signal to compensate for nonlinear responses of the voltage-variable capacitances of the first and second semiconductor diodes.

19. The network of claim 18 wherein the second bias voltage reverse-biases the second semiconductor diode.

20. The network of claim 18 wherein the first semiconductor diode comprises a light-source semiconductor diode.

21. The network of claim 18 further comprising a source for the varying signal, and;

an inductor and a capacitor, both coupled between the varying signal source and a D.C. power supply of the D.C. power supply circuit, the inductor for preventing passage of a signal from the varying signal source into a D.C. power supply of the D.C. power supply circuit, and the capacitor for preventing passage of D.C. power from the D.C. power supply circuit into the varying signal source.

22. The network of claim 18 wherein the D.C. power supply circuit comprises a power supply having a first terminal coupled to a first end of the first semiconductor diode, a second terminal coupled to a first end of the second semiconductor diode, and a ground terminal coupled to a second end of the first semiconductor diode and a second end of the second semiconductor diode.

23. The network of claim 18 wherein the D.C. power supply circuit comprises a first and a second power supply, the first power supply coupled to the first semiconductor diode and applying the first bias voltage, and the second power supply coupled to the second semiconductor diode and applying the second bias voltage.

24. The network of claim 23 further comprising a capacitor coupled between the first and second semiconductor diodes.

25. The network of claim 18 further comprising a load for detecting a signal therethrough and wherein the first semiconductor diode is coupled to the load.

26. The network of claim 25 wherein the first semiconductor diode comprises a photodetector.

27. The network of claim 25 wherein the second semiconductor diode comprises a photodetector.

28. The network of claim 18 wherein the first semiconductor diode comprises an RF diode.

29. The network of claim 18 wherein the first semiconductor diode comprises a microwave diode.

30. The network of claim 18 further comprising a variable resistor coupled in series with a D.C. power supply of the D.C. power supply circuit and the second semiconductor diode.

* * * * *